United States Patent
Harumoto et al.

(10) Patent No.: US 7,597,491 B2
(45) Date of Patent: Oct. 6, 2009

(54) APPARATUS FOR AND METHOD OF PROCESSING SUBSTRATE

(75) Inventors: Masahiko Harumoto, Kyoto (JP); Masakazu Sanada, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 662 days.

(21) Appl. No.: 11/245,347

(22) Filed: Oct. 6, 2005

(65) Prior Publication Data

US 2006/0088791 A1 Apr. 27, 2006

(30) Foreign Application Priority Data

Oct. 27, 2004 (JP) .............................. 2004-311966

(51) Int. Cl.
G03D 5/00 (2006.01)
G03F 1/00 (2006.01)

(52) U.S. Cl. ...................... 396/611; 396/627; 430/325

(58) Field of Classification Search ................ 396/611, 396/627; 118/52, 326; 430/325, 326; 355/27
See application file for complete search history.

(56) References Cited

U.S. PATENT DOCUMENTS

| | | | |
|---|---|---|---|
| 2001/0009452 A1 | 7/2001 | Matsuyama et al. | |
| 2001/0014224 A1* | 8/2001 | Hasebe et al. | 396/579 |
| 2002/0121341 A1* | 9/2002 | Tanaka et al. | 156/345.21 |
| 2004/0096760 A1* | 5/2004 | Tateyama et al. | 430/30 |

FOREIGN PATENT DOCUMENTS

| | | |
|---|---|---|
| JP | 2001-274082 | 10/2001 |
| JP | 2002-075821 | 3/2002 |
| JP | 2003-332228 | 11/2003 |

OTHER PUBLICATIONS

English translation of JP 10-20508 (dated Jan. 23, 1998).*
English translation of JP 2003-100601 (dated Apr. 4, 2003).*
Office Action issued by Japanese Patent Office on May 13, 2009 in connection with corresponding Japanese Patent Application No. 2004-311966.
English translation of Japanese Office Action issued May 13, 2009 submitted as a statement of relevancy of the prior art against instant application.

* cited by examiner

*Primary Examiner*—Alan A Mathews
(74) *Attorney, Agent, or Firm*—Ostrolenk Faber LLP

(57) ABSTRACT

A puddle of developer supplied from a developer discharge nozzle is placed on a substrate held stationary. Next, the substrate is held stationary for a predetermined length of time, with the puddle of developer allowed to remain on the substrate. This causes a development reaction to proceed. Subsequently, deionized water is supplied from a deionized water discharge nozzle to the substrate to stop the development reaction, and the substrate is rotated while part of the puddle of developer is allowed to remain on the surface of the substrate. This makes a dissolution product easy to diffuse in the developer remaining on the surface of the substrate to promote the dissolution of the resist. A rinsing process and a drying process are performed to complete the development process.

6 Claims, 9 Drawing Sheets

FIG. 5
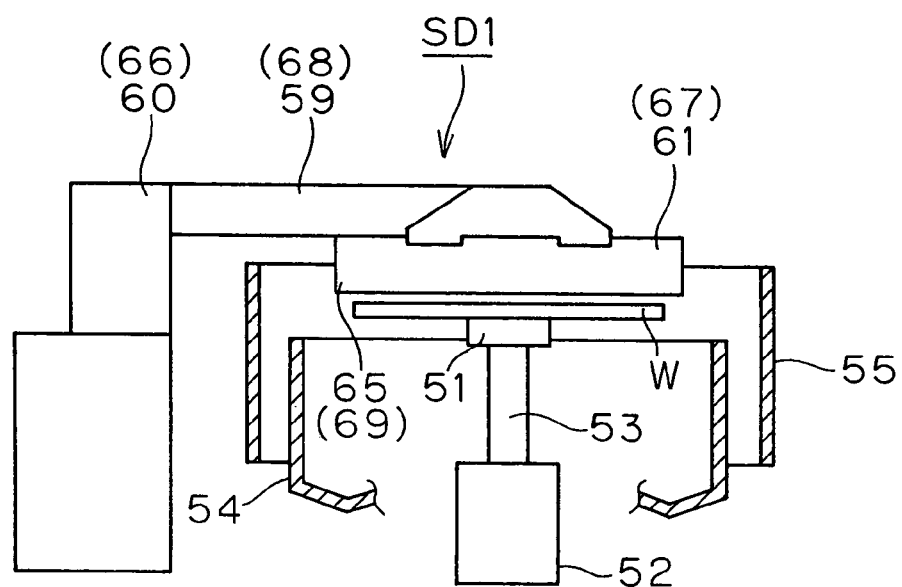
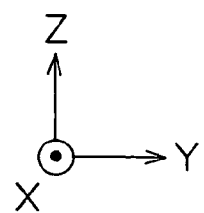

APPARATUS FOR AND METHOD OF PROCESSING SUBSTRATE

BACKGROUND OF THE INVENTION

1. Field of the Invention

The present invention relates to a substrate processing apparatus and a substrate processing method which perform a development process on a substrate including a semiconductor substrate, a glass substrate for a liquid crystal display device, a glass substrate for a photomask, a substrate for an optical disk, and the like. More particularly, the present invention relates to an improvement in procedure of the development process.

2. Description of the Background Art

A development processing apparatus for performing a development process on a resist film formed on a substrate subjected to an exposure process has been conventionally known. The conventional development processing apparatus executes the steps of: (1) allowing a puddle of developer (or developing solution) to remain on a substrate for a predetermined length of time to cause a development reaction to proceed; (2) performing a rinsing process for rinsing the developer adhering to the surface of the substrate away with deionized water; and (3) spinning off the deionized water adhering to the substrate to dry the substrate.

It is a known phenomenon that a dissolution product of the resist generated by the development reaction is not removed from the substrate, and such a resist residue becomes a development defect to cause a substrate processing failure in a subsequent step. An attempt has conventionally been made to solve the processing failure resulting from the development defect by sufficiently prolonging the rinsing processing time.

However, setting a long period of time for the rinsing process gives rise to a problem that the throughput of the entire apparatus decreases. There arises another problem that the dissolution product of the resist cannot be removed from the substrate even if the long rinsing time is set.

SUMMARY OF THE INVENTION

The present invention is intended for a substrate processing apparatus for performing a development process on a resist film formed on a surface of a substrate.

According to the present invention, the substrate processing apparatus comprises: a rotary holder for rotating the substrate while holding the substrate; a developer supply part for supplying a developer to the surface of the substrate held by the rotary holder; a deionized water supply part for supplying deionized water to the surface of the substrate held by the rotary holder; and a controller for controlling operations of the rotary holder and the deionized water supply part, the controller being capable of causing the deionized water supply part to supply the deionized water to the resist film in which a development reaction due to the developer supplied proceeds, thereby to stop the development reaction of the resist film, and causing the rotary holder to rotate the substrate while allowing part of the developer supplied to the surface of the substrate to remain thereon, the controller being capable of then causing the deionized water supply part to supply the deionized water while causing the rotary holder to rotate the substrate, whereby a rinsing process is performed on the substrate.

The substrate processing apparatus efficiently removes resist residues (development defects) deposited on the substrate in the rinsing process to prevent a substrate processing failure resulting from the resist residues.

Preferably, the deionized water supply part includes a first deionized water nozzle for discharging a stream of deionized water whose width is not less than the diameter or width of the substrate, the first deionized water nozzle being capable of substantially translating over the substrate, and a second deionized water nozzle capable of supplying the deionized water to the vicinity of the center of the substrate. The first deionized water nozzle supplies the deionized water while moving substantially in parallel with the surface of the substrate when stopping the development reaction. The second deionized water nozzle supplies the deionized water when performing the rinsing process.

This stops the development process substantially at the same time throughout the substrate to achieve the execution of the substantially uniform development process throughout the substrate.

According to another aspect of the present invention, the substrate processing apparatus comprises: a first unit for performing a first process included in the development process; a second unit for performing a second process included in the development process, the second process being performed subsequently to the first process; and a transport unit for transferring a substrate between the first and second units.

This allows the first process and the second process to be executed in parallel, thereby improving the throughput of the development process.

Preferably, the first unit includes a first rotary holder for rotating the substrate while holding the substrate, a developer supply part for supplying a developer to the surface of the substrate held by the first rotary holder, a first deionized water supply part for supplying deionized water to the surface of the substrate held by the first rotary holder, and a first controller for controlling operations of the first rotary holder and the first deionized water supply part, the controller causing the first deionized water supply part to supply the deionized water to the resist film in which a development reaction due to the developer supplied proceeds, thereby to stop the development reaction, and causing the first rotary holder to rotate the substrate while allowing part of the developer supplied to the surface of the substrate to remain thereon. The second unit includes a second rotary holder for rotating the substrate while holding the substrate, a second deionized water supply part for supplying deionized water to the surface of the substrate held by the second rotary holder, and a second controller for causing the second deionized water supply part to supply the deionized water while causing the second rotary holder to rotate the substrate, whereby a rinsing process is performed on the substrate.

The substrate subjected to the first process is transported to the second unit, and the second unit performs the rinsing process. This efficiently removes the resist residues deposited on the substrate, and improves the throughput of the development process.

It is therefore an object of the present invention to provide a substrate processing apparatus capable of performing a good development process without the decrease in throughput.

These and other objects, features, aspects and advantages of the present invention will become more apparent from the following detailed description of the present invention when taken in conjunction with the accompanying drawings.

BRIEF DESCRIPTION OF THE DRAWINGS

FIG. 5 is a sectional view of the development processing unit taken along the line V-V of FIG. 4;

DESCRIPTION OF THE PREFERRED EMBODIMENTS

Preferred embodiments according to the present invention will now be described in detail with reference to the drawings.

1. First Preferred Embodiment

1.1. Construction of Substrate Processing Apparatus

Figure 1:
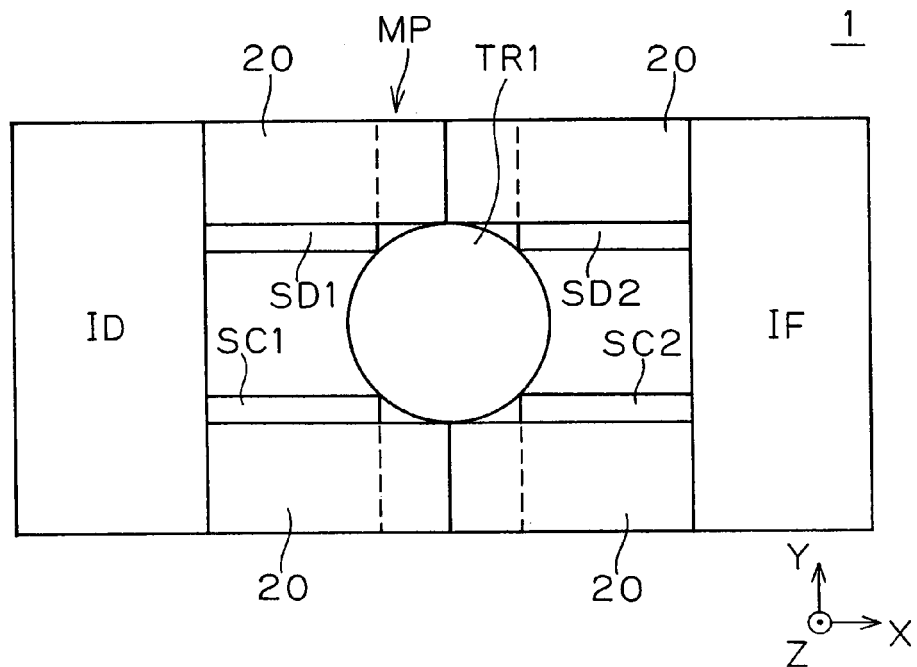
FIG. 1 is a plan view of a substrate processing apparatus according to first to third preferred embodiments of the present invention.
Figure 2:
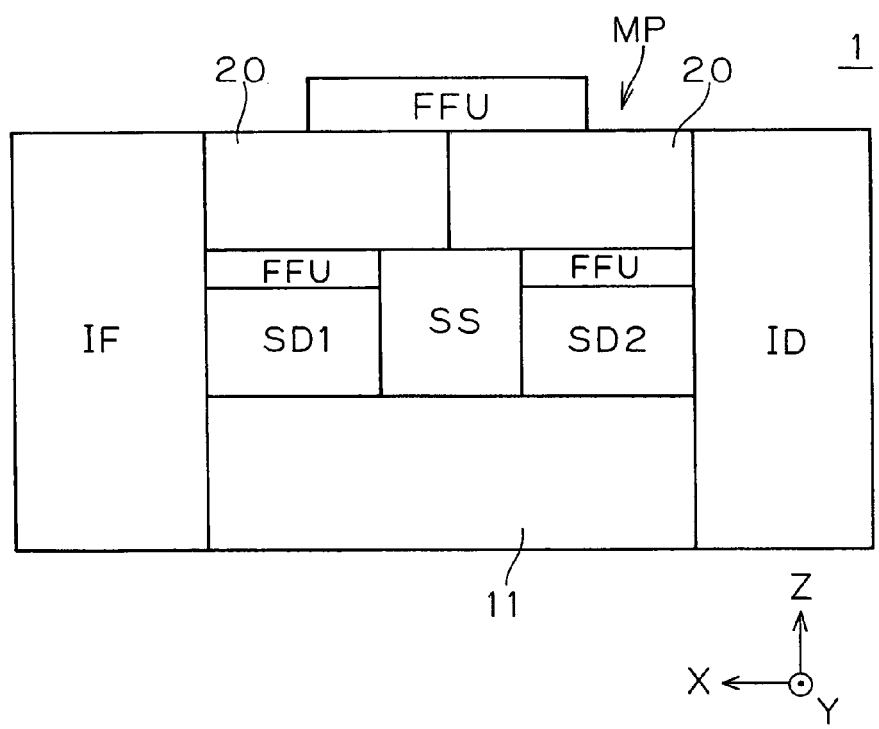
FIG. 2 is a front view of the substrate processing apparatus according to the first to third preferred embodiments of the present invention.

FIGS. 1 and 2 are a plan view and a front view, respectively, of a substrate processing apparatus 1 according to first, second and third preferred embodiments of the present invention. The substrate processing apparatus 1 is a so-called single-substrate type apparatus for performing the process of coating a circular substrate with a resist, the process of developing a substrate exposed by an exposure apparatus (not shown) constructed as an apparatus external to the substrate processing apparatus 1, the process of heat treatment, and the like. An XYZ rectangular coordinate system in which the horizontal plane is defined as an XY plane and the vertical direction as a Z direction is additionally shown in FIG. 1 and its subsequent figures for purposes of clarifying the directional relationship therebetween.

As shown in FIG. 1, the substrate processing apparatus 1 principally includes an indexer ID for transporting an unprocessed substrate into the substrate processing apparatus 1 and for transporting a processed substrate out of the substrate processing apparatus 1, a unit arrangement part MP including a plurality of processing units and a transport robot, and an interface IF for transporting a substrate into and out of the exposure apparatus (not shown).

A liquid process using deionized water and liquid chemicals (referred to hereinafter as a "processing liquid") and heat treatment are performed on a substrate in the unit arrangement part MP. As shown in FIGS. 1 and 2, the unit arrangement part MP principally includes coating processing units SC1 and SC2, development processing units SD1 and SD2, a transport robot TR1, a rinsing processing unit SS, and multi-tier heat treatment parts 20.

As shown in FIG. 2, a chemical cabinet 11 for accommodating a tank for storing a chemical agent, piping and the like is disposed in a lowermost portion of the unit arrangement part MP. The coating processing units SC1 and SC2 and the development processing units SD1 and SD2 are disposed on the chemical cabinet 11 and in the four corners of the unit arrangement part MP.

Each of the coating processing units SC1 and SC2 performs the process of coating a surface of a substrate with a resist while rotating or spinning the substrate. This forms a resist film on the surface of the substrate. Each of the development processing units SD1 and SD2 places a puddle of developer discharged from a discharge slit 65 (See FIG. 5 to be described later) on the substrate subjected to the exposure process to perform a development process on the resist film formed on the surface of the substrate.

A chemically amplified resist is used as the resist material in the coating processing units SC1 and SC2 according to the first preferred embodiment. A hardware construction of the development processing units SD1 and SD2 will be described later.

The rinsing processing unit SS is disposed between the development processing units SD1 and SD2, as shown in FIG. 2. The rinsing processing unit SS supplies a processing liquid onto the surface of the substrate while rotating or spinning the substrate to perform a rinsing process. A hardware construction of the rinsing processing unit SS will be described later.

Figure 3:
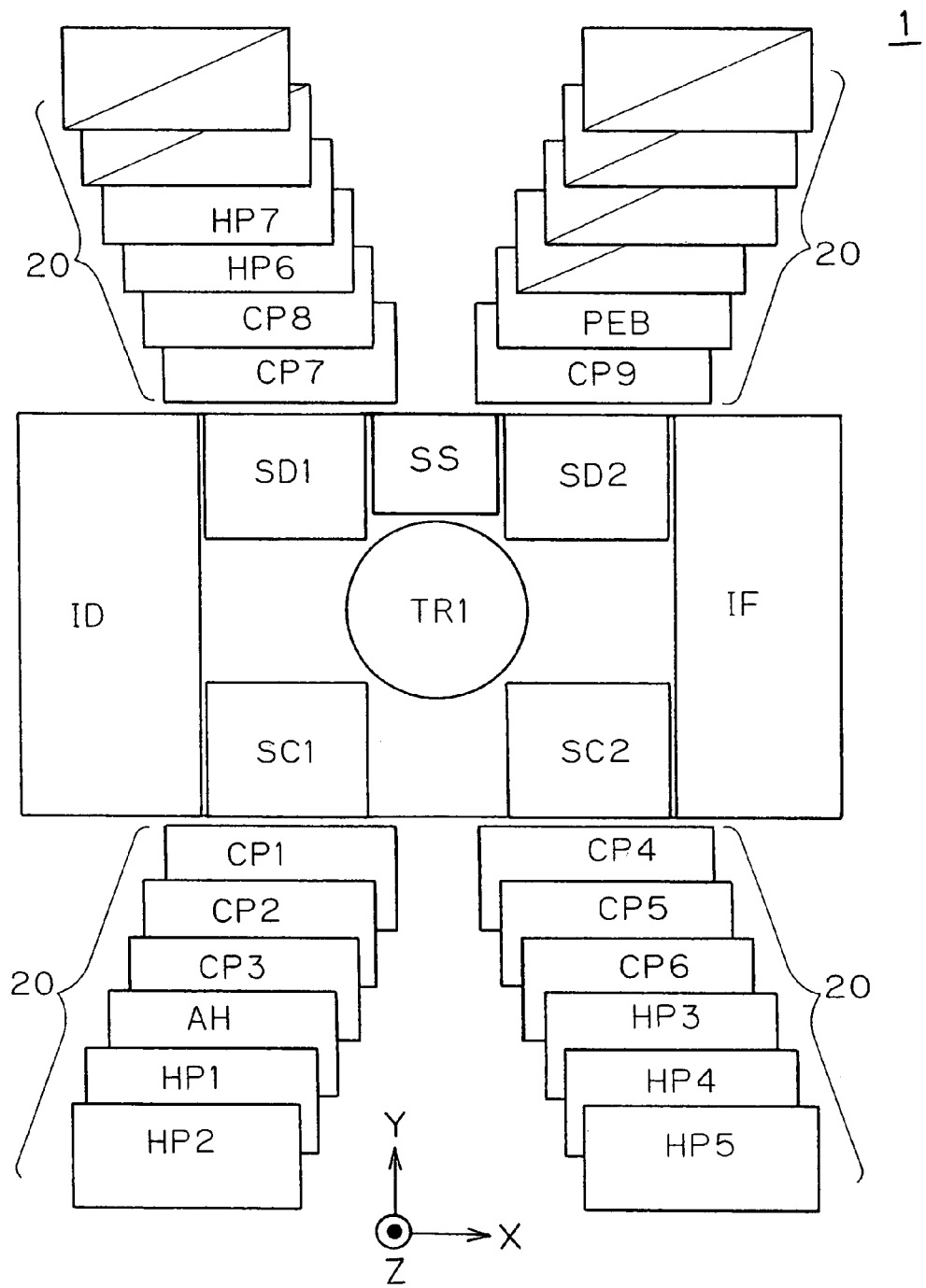
FIG. 3 is a view for illustrating the arrangement of processing units constituting the substrate processing apparatus.

FIG. 3 is a view for illustrating the arrangement of processing units constituting the substrate processing apparatus 1. As shown in FIGS. 2 and 3, the multi-tier heat treatment parts 20 are disposed over the coating processing units SC1 and SC2 and the development processing units SD1 and SD2, respectively, and perform heat treatment on a substrate. As shown in FIG. 3, each of the multi-tier heat treatment parts 20 can contain six processing units stacked in tiers.

Over the coating processing unit SC1, cool plates CP1 to CP3 for performing a cooling process on a substrate are disposed in the first to third tier positions, respectively, counting upwardly from the bottom. An adhesion promoter AH for performing an adhesion promotion process on a substrate is disposed in the fourth tier position. Hot plates HP1 and HP2 for performing a heating process on a substrate are disposed in the fifth and sixth tier positions, respectively.

Over the coating processing unit SC2, cool plates CP4 to CP6 are disposed in the first to third tier positions, respectively, counting upwardly from the bottom. Hot plates HP3 to HP5 are disposed in the fourth to sixth tier positions, respectively.

Over the development processing unit SD1, cool plates CP7 and CP8 are disposed in the first and second tier positions, respectively, counting upwardly from the bottom. Hot plates HP6 and HP7 are disposed in the third and fourth tier positions, respectively. Although the uppermost two tiers are vacant in the apparatus of this preferred embodiment, a hot plate, a cool plate, or other thermal processing units may be installed in the uppermost two tiers in accordance with applications and purposes.

Over the development processing unit SD2, a cool plate CP9 is disposed in the first tier position, and a post-exposure bake unit PEB for performing a post-exposure bake process on a substrate is disposed in the second tier position, counting upwardly from the bottom. Although the uppermost four tiers are vacant in the apparatus of this preferred embodiment, a thermal processing unit may be installed in the uppermost four tiers, as required.

As shown in FIG. 1, the transport robot TR1 capable of the operation of transferring and receiving a substrate to and from all of the processing units provided therearound is disposed in a central portion of the unit arrangement part MP surrounded by the coating processing units SC1 and SC2, the rinsing processing unit SS, and the development processing units SD1 and SD2. For example, the transport robot TR1 can receive a substrate processed in the development processing unit SD1 and transfer the substrate to the rinsing processing unit SS. The transport robot TR1 can also transfer a substrate between each of the units of the multi-tier heat treatment parts 20 and the development processing unit SD1.

As illustrated in FIG. 2, filter fan units FFU are provided on top of the unit arrangement part MP and immediately under the multi-tier heat treatment parts 20. This allows the formation of a downflow of clean air in the unit arrangement part MP.

1.2. Construction of Development Processing Units and Rinsing Processing Unit The hardware construction of the development processing units SD1 and SD2 and the rinsing processing unit SS which are arranged in the unit arrangement part MP will be described.

Figure 4:
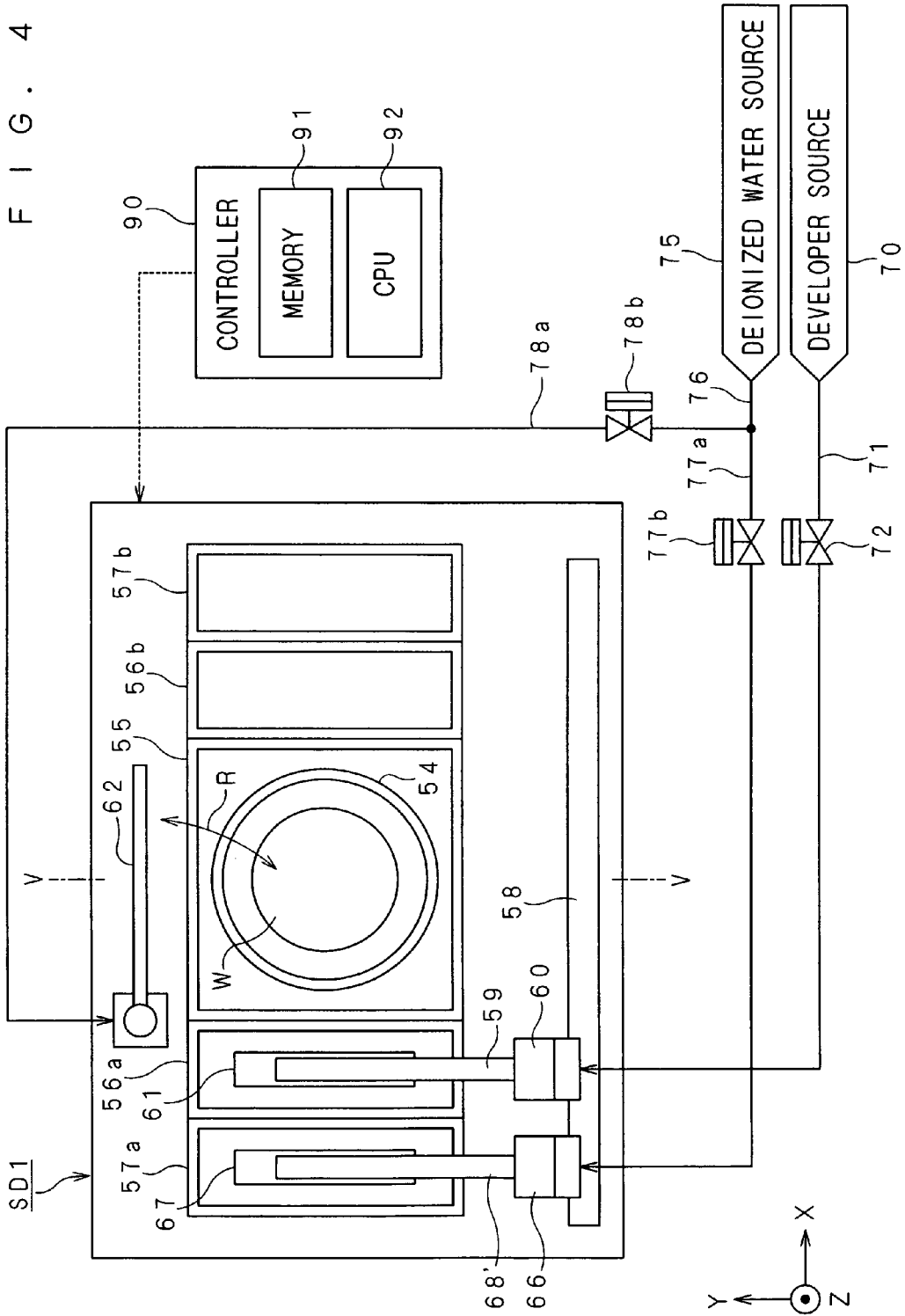
FIG. 4 is a plan view of a development processing unit.

FIG. 4 is a plan view of the development processing unit SD1. FIG. 5 is a sectional view of the development processing unit SD1 taken along the line V-V of FIG. 4. In the first preferred embodiment, the development processing units SD1 and SD2 are substantially identical in hardware construction with each other. Thus, only the development processing unit SD1 will be described below.

As illustrated in FIGS. 4 and 5, the development processing unit SD1 principally includes a substrate holder 51, a developer discharge nozzle 61, deionized water discharge nozzles 62 and 67, and a controller 90.

The substrate holder 51 holds a substrate W in a substantially horizontal position under suction. The substrate holder 51 is operatively connected with a motor 52 through a rotary shaft 53. Thus, the substrate holder 51 drives the motor 52 while holding the substrate W under suction to rotatably hold the substrate W.

An inner cup 54 is provided to surround the substrate W held by the substrate holder 51. A square outer cup 55 is provided around the inner cup 54.

A pair of standby pots 56a and 56b serving as a standby part for the developer discharge nozzle 61 are provided on opposite sides of the outer cup 55. A standby pot 57a is provided on the opposite side of the standby pot 56a from the outer cup 55, and a standby pot 57b is provided on the opposite side of the standby pot 56b from the outer cup 55. The standby pots 57a and 57b are used as a standby part for the deionized water discharge nozzle 67.

The developer discharge nozzle 61 has a linear shape extending along the Y-axis, and is mounted on a lower end portion of a nozzle arm 59 so as to assume a substantially horizontal position, as shown in FIG. 5. The nozzle arm 59 is supported by an arm driver 60 as illustrated in FIGS. 4 and 5, and the arm driver 60 can translate the nozzle arm 59 along a guide rail 58 extending along the X-axis. This allows the reciprocal movement of the developer discharge nozzle 61 from the standby pot 56a via over the substrate holder 51 to the standby pot 56b and vice versa.

The developer discharge nozzle 61 includes the discharge slit 65 extending along the Y-axis, and the width of a stream of developer discharged from the discharge slit 65 is set to be equal to or greater than the diameter of the substrate W. The developer discharge nozzle 61 is operatively connected with a developer source 70 through a pipe 71 and a valve 72, as shown in FIG. 4.

Thus, substantially translating the developer discharge nozzle 61 along the guide rail 58 and controlling the opening and closing of the valve 72 in properly timed relation and the amount of supply of the developer achieve the supply of the developer with the above-mentioned stream width to a substrate to place a puddle of developer uniformly. That is, the developer discharge nozzle 61 may be used as a developer supply part in the first preferred embodiment.

Like the developer discharge nozzle 61, the deionized water discharge nozzle 67 has a linear shape extending along the Y-axis, and is mounted on a lower end portion of a nozzle arm 68 so as to assume a substantially horizontal position (See FIG. 5). The nozzle arm 68 is supported by an arm driver 66, and the arm driver 66 can translate the nozzle arm 68 along the guide rail 58. This allows the reciprocal movement of the deionized water discharge nozzle 67 from the standby pot 57a via over the substrate holder 51 to the standby pot 57b and vice versa.

The deionized water discharge nozzle 67 includes a discharge slit 69 extending along the Y-axis, and the width of a stream of deionized water discharged from the discharge slit 69, like the discharge slit 65, is set to be equal to or greater than the diameter of the substrate W. The deionized water discharge nozzle 67 is operatively connected with a deionized water source 75 through a common pipe 76, a branch pipe 77a and a valve 77b, as shown in FIG. 4.

Thus, substantially translating the deionized water discharge nozzle 67 along the guide rail 58 and controlling the opening and closing of the valve 77b in properly timed relation and the amount of supply of the deionized water achieve the supply of the deionized water with the above-mentioned stream width to a substrate. That is, the deionized water discharge nozzle 67 may be used as a deionized water supply part in the first preferred embodiment.

The deionized water discharge nozzle 62 is provided on one side of the outer cup 55, as shown in FIG. 4, and is pivotable in directions indicated by the arrow R. The deionized water discharge nozzle 62 is operatively connected with the deionized water source 75 through the common pipe 76, a branch pipe 78a, and a valve 78b.

Thus, moving a nozzle tip of the deionized water discharge nozzle 62 to over the substrate W and controlling the opening and closing of the valve 78b in properly timed relation and the amount of supply of the deionized water achieve the supply of the deionized water to the vicinity of the center of the substrate W. That is, the deionized water discharge nozzle 62 may be used as a deionized water supply part in the first preferred embodiment.

As illustrated in FIG. 4, the controller 90 includes a memory 91 for storing a program, variables and the like, and a CPU 92 for effecting control in accordance with the program stored in the memory 91. In accordance with the program stored in the memory 91, the CPU 92 can control the opening and closing of the valves 72, 77b and 78b, the driving of the motor 52 and the arm drivers 60 and 66, and the like in predetermined timed relation.

Figure 6:
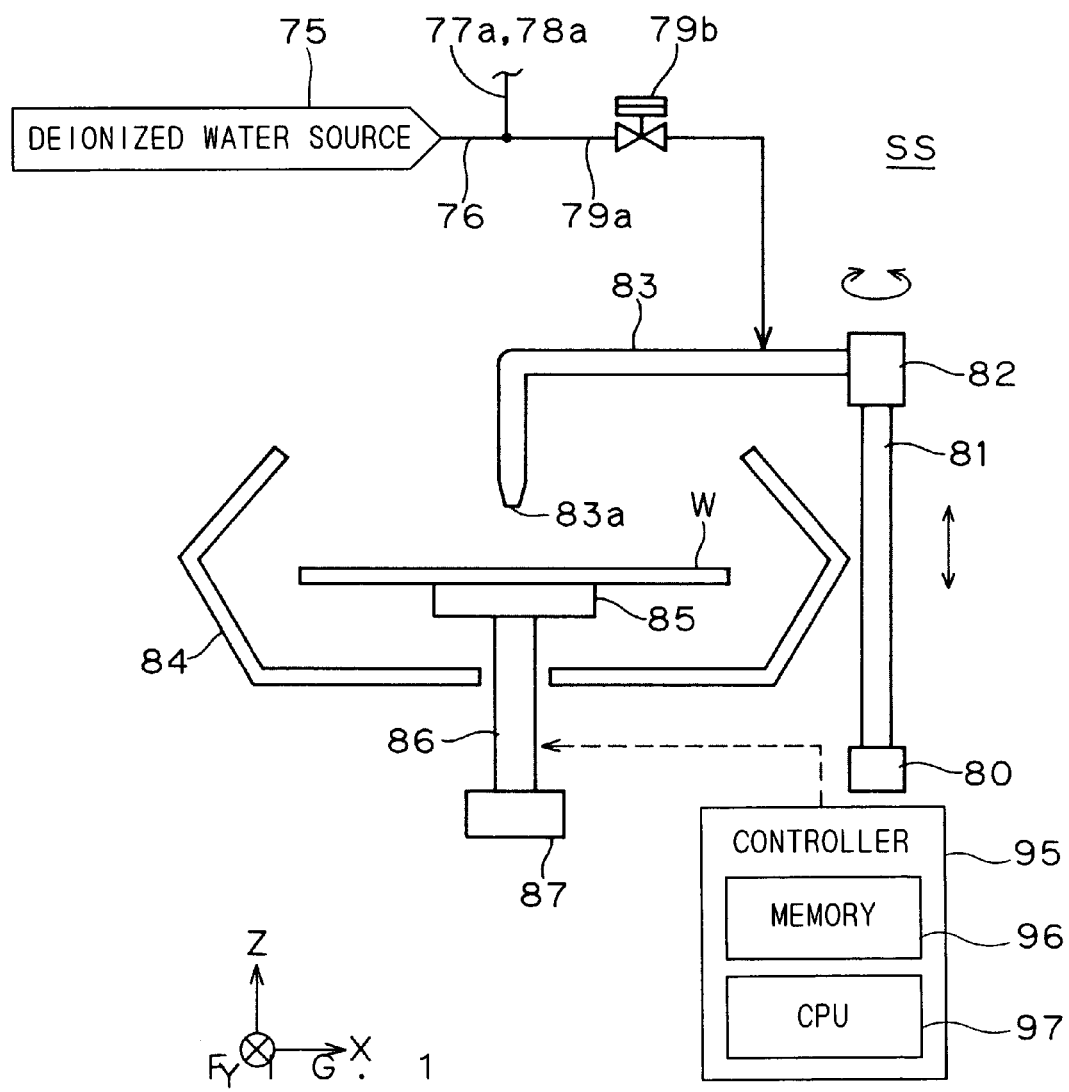
FIG. 6 is a front view of a rinsing processing unit.

Next, the rinsing processing unit SS will be described. FIG. 6 is a front view of the rinsing processing unit SS. As shown in FIG. 6, the rinsing processing unit SS principally includes a substrate holder 85, a deionized water discharge nozzle 83, and a controller 95.

The substrate holder 85 holds a substrate W in a substantially horizontal position under suction. The substrate holder 85 is operatively connected with a motor 87 through a rotary shaft 86. Thus, the substrate holder 85 drives the motor 87 while holding the substrate W under suction to rotatably hold the substrate W.

A cup 84 is provided to surround the substrate W held by the substrate holder 85. The cup 84 can receive and collect deionized water spattered around by centrifugal force due to the rotation when the deionized water is supplied to the substrate W while the substrate W is rotated.

The deionized water discharge nozzle 83 is disposed over the substrate holder 85. The deionized water discharge nozzle 83 is supported by a nozzle pivoting motor 82, and is pivotable about a rotary shaft 81 by driving the nozzle pivoting motor 82. The deionized water discharge nozzle 83 is moved vertically (along the Z-axis) up and down by operating a nozzle lifter 80. The deionized water discharge nozzle 83 is operatively connected with the deionized water source 75 through the common pipe 76, a branch pipe 79a and a valve 79b, as shown in FIG. 6.

Thus, moving a discharge opening 83a of the deionized water discharge nozzle 83 to over the substrate W and controlling the opening and closing of the valve 79b in properly timed relation and the amount of supply of the deionized water achieve the supply of the deionized water to the vicinity of the center of the substrate W. That is, the deionized water discharge nozzle 83 may be used as a deionized water supply part in the first preferred embodiment.

As illustrated in FIG. 6, the controller 95 includes a memory 96 for storing a program, variables and the like, and a CPU 97 for effecting control in accordance with the program stored in the memory 96. In accordance with the program stored in the memory 96, the CPU 97 can control the opening and closing of the valve 79b, the driving of the motor 87 and the nozzle pivoting motor 82, and the like in predetermined timed relation.

1.3. Procedure of Development Process

Figure 7:
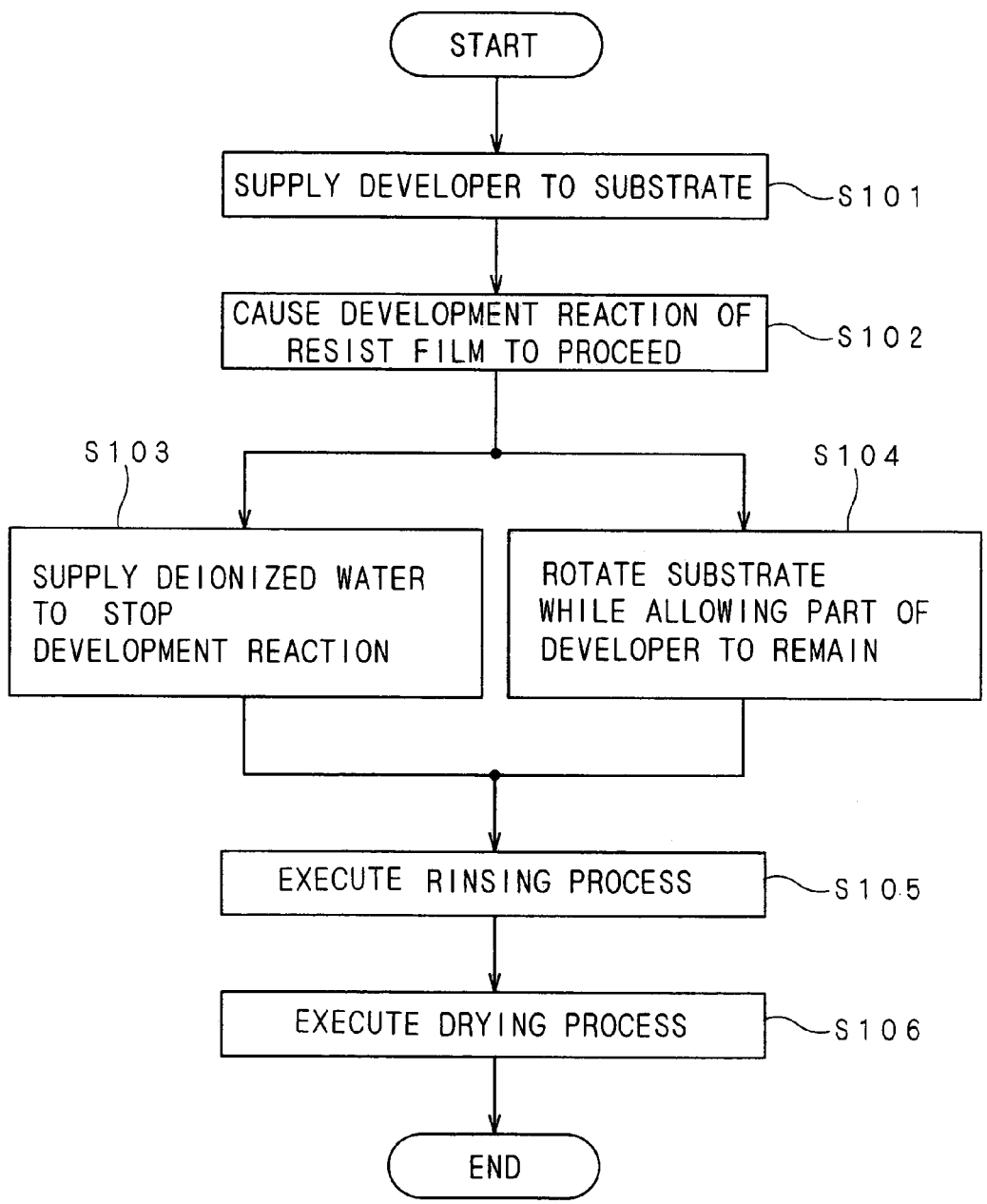
FIG. 7 is a flow chart showing a procedure of a development process according to the first preferred embodiment of the present invention.

FIG. 7 is a flow chart for illustrating a procedure of the development process according to the first preferred embodiment of the present invention. Because the development processing units SD1 and SD2 can execute the similar development process, only the development process by means of the development processing unit SD1 will be described.

When a substrate W subjected to heat treatment in the post-exposure bake unit PEB (See FIG. 3) after the exposure process is transported into the development processing unit SD1 by the transport robot TR1, the substrate W is held under suction by the substrate holder 51. Subsequently, the developer discharge nozzle 61 is moved along the guide rail 58 and the valve 72 is opened in predetermined timed relation to supply the developer to the surface of the substrate W held stationary, thereby forming a puddle of developer (in Step S101).

Then, the substrate W is held stationary for a predetermined length of time, with the puddle of developer allowed to remain thereon. This causes a development reaction of a resist film to proceed (in Step S102).

Figure 8:
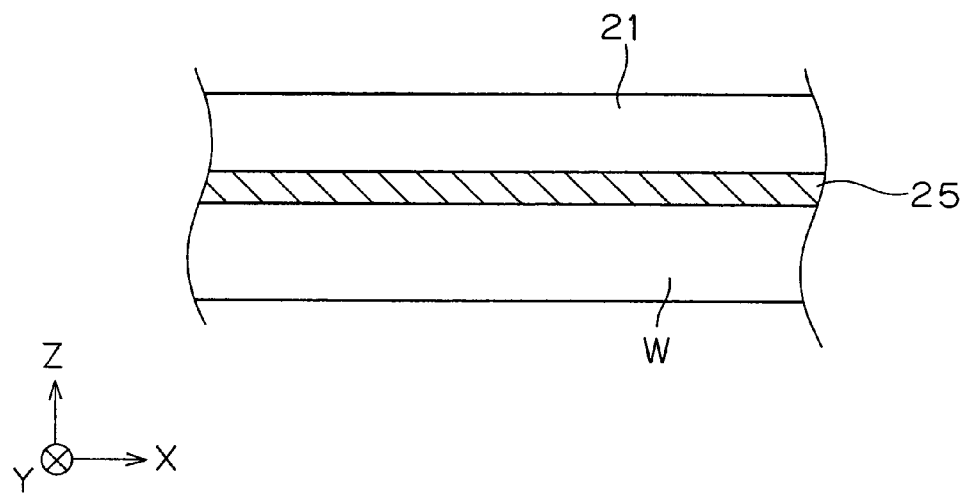
FIGS. 8 to 11 are views for illustrating the process of developing a resist film formed on a surface of a substrate.
Figure 9:
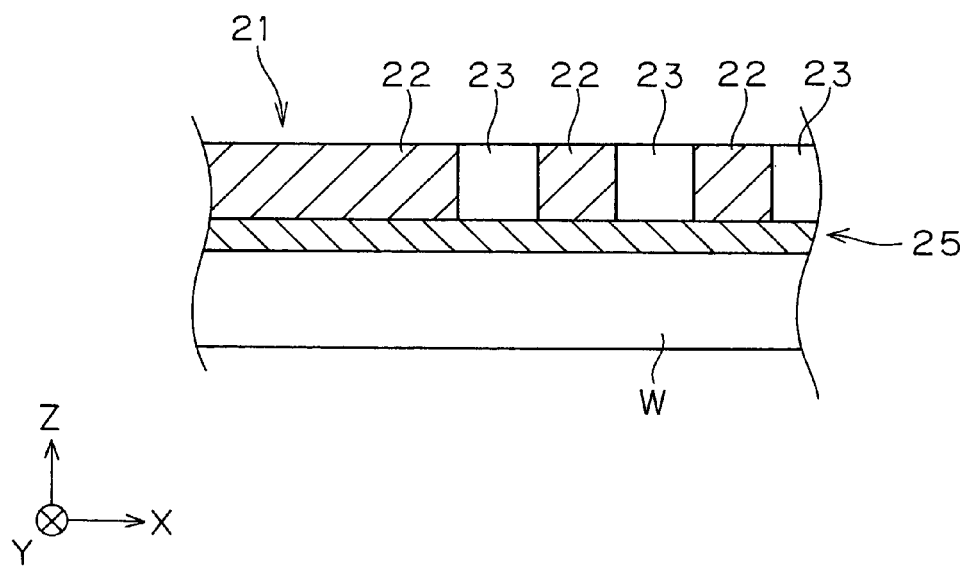
Figure 10:
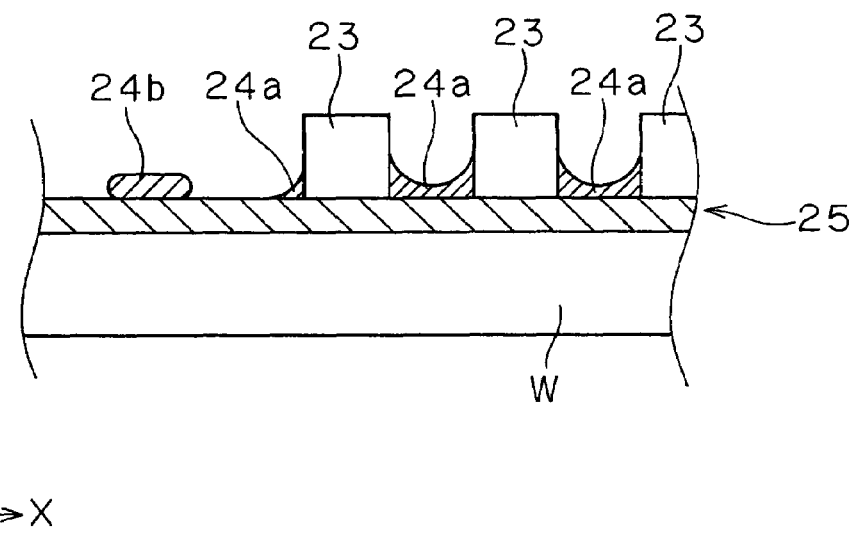

FIGS. 8 to 11 are views for illustrating the development process of the resist film. As illustrated in FIG. 8, an anti-reflection film 25 is formed on the substrate W, and a thin film 21 of chemically amplified positive resist is formed on the anti-reflection film 25. When the exposure process is performed on such a substrate W, the exposure process creates an acid catalyst in a portion exposed to light to form a pattern of traces having a three-dimensional distribution in the form of a latent image in the resist film. Thus, when the developer which is an alkaline aqueous solution is supplied to the substrate W after the heat treatment, the acid catalyst in the portion exposed to light is neutralized by the developer. As a result, the neutralized portion becomes a dissolution product 22 (See FIG. 9) which is soluble. The progress of such neutralization reaction causes the development reaction to proceed.

The background art development process supplies the deionized water to the substrate W while rotating the substrate W after the neutralization reaction is executed using the developer for a predetermined length of time, thereby to perform the process of removing the dissolution product 22 while stopping the development reaction.

The dissolution product 22 made soluble by the developer, however, is not removed from the resist film when the substrate W is stationary. The dissolution product 22 also is not completely removed only by the execution of the rinsing process after the stop of the development reaction, but the following phenomena occur: (1) a dissolution product 24a remains between the traces 23 of the pattern, and (2) a dissolution product 24b is deposited again on the anti-reflection film 25 after the dissolution product 24b is temporarily removed from the resist film (See FIG. 10). The dissolution products 24a and 24b remaining as resist residues on the substrate W become a development defect to cause a substrate processing failure in a subsequent step.

The first preferred embodiment according to the present invention solves this problem by executing Steps S103 and S104 in parallel prior to the execution of the rinsing process. Specifically, the deionized water discharge nozzle 67 is moved along the guide rail 58, and the valve 77b is opened in predetermined timed relation, thereby to supply at least an amount of deionized water required to stop the development reaction to the entire substrate held by the substrate holder 51 (in Step S103). Additionally, the substrate W is rotated for a predetermined length of time at a rotation speed which allows part of the puddle of developer to remain on the surface of the substrate W (in Step S104).

This achieve the supply of the deionized water with the above-mentioned stream width from the deionized water discharge nozzle 67 to allow the uniform supply of the deionized water to the entire substrate W. The first preferred embodiment accordingly uniformly stops the development reaction proceeding on the resist film. Also, the first preferred embodiment imparts kinetic energy created by centrifugal force to the substrate W, thereby to impart the kinetic energy to the dissolution product 22. This makes the dissolution product 22 easy to diffuse in the developer remaining on the surface of the substrate W to promote the dissolution of the resist.

The processes in Step S103 and Step S104 may be such that the process of rotating the substrate W is performed after the execution of the process of stopping the development reaction. In other words, Steps S103 and S104 may be either parallel as shown in FIG. 7 or sequential.

Figure 11:
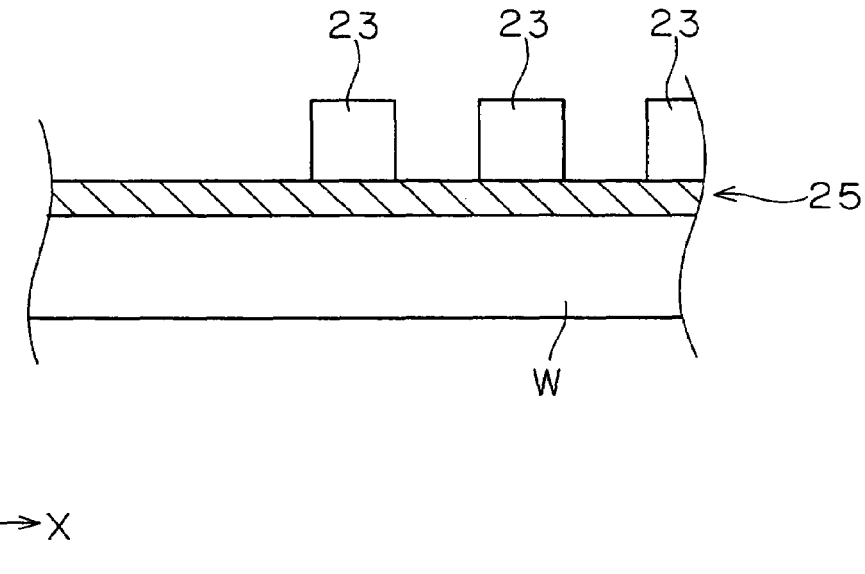

After the completion of Steps S103 and S104, the speed of rotation of the substrate W is increased, and the deionized water is supplied to the vicinity of the center of the substrate W by using the deionized water discharge nozzle 62 (in Step S105). Thus, the supplied deionized water flows from the vicinity of the center of the substrate W toward a peripheral portion thereof due to centrifugal force to easily remove the dissolution product 22 of the resist film, thereby preventing the development defect. That is, no dissolution products remain between the traces 23 of the pattern and on the anti-reflection film 25 as shown in FIG. 11, and the satisfactory development process is accomplished.

Subsequently, after the completion of the rinsing process, further increasing the speed of rotation of the substrate W spins off the deionized water adhering to the surface of the substrate W, whereby a drying process is performed on the substrate W (in Step S106). The development process is completed by the completion of the drying process of the substrate W.

1.4. Advantages of Substrate Processing Apparatus of First Preferred Embodiment As described hereinabove, the substrate processing apparatus 1 according to the first preferred embodiment is capable of imparting the kinetic energy created by centrifugal force to the substrate W while allowing part of the developer to remain on the surface of the substrate W prior to the execution of the rinsing process in Step S105. This makes the dissolution product 22 of the resist easy to diffuse in the developer remaining on the surface of the substrate W to promote the dissolution of the resist. Therefore, the substrate processing apparatus 1 efficiently removes the dissolution products (resist residues) deposited on the substrate in the rinsing process.

2. Second Preferred Embodiment

Next, a second preferred embodiment according to the present invention will be described. The substrate processing apparatus of the second preferred embodiment is similar to that of the first preferred embodiment except that a different procedure of the development process is executed in the controller 90. Specifically, the substrate processing apparatus of the second preferred embodiment is similar in hardware construction to that of the first preferred embodiment but differs therefrom in program executed in the controller 90. The difference will be mainly described below.

2.1. Procedure of Development Process

Figure 12:
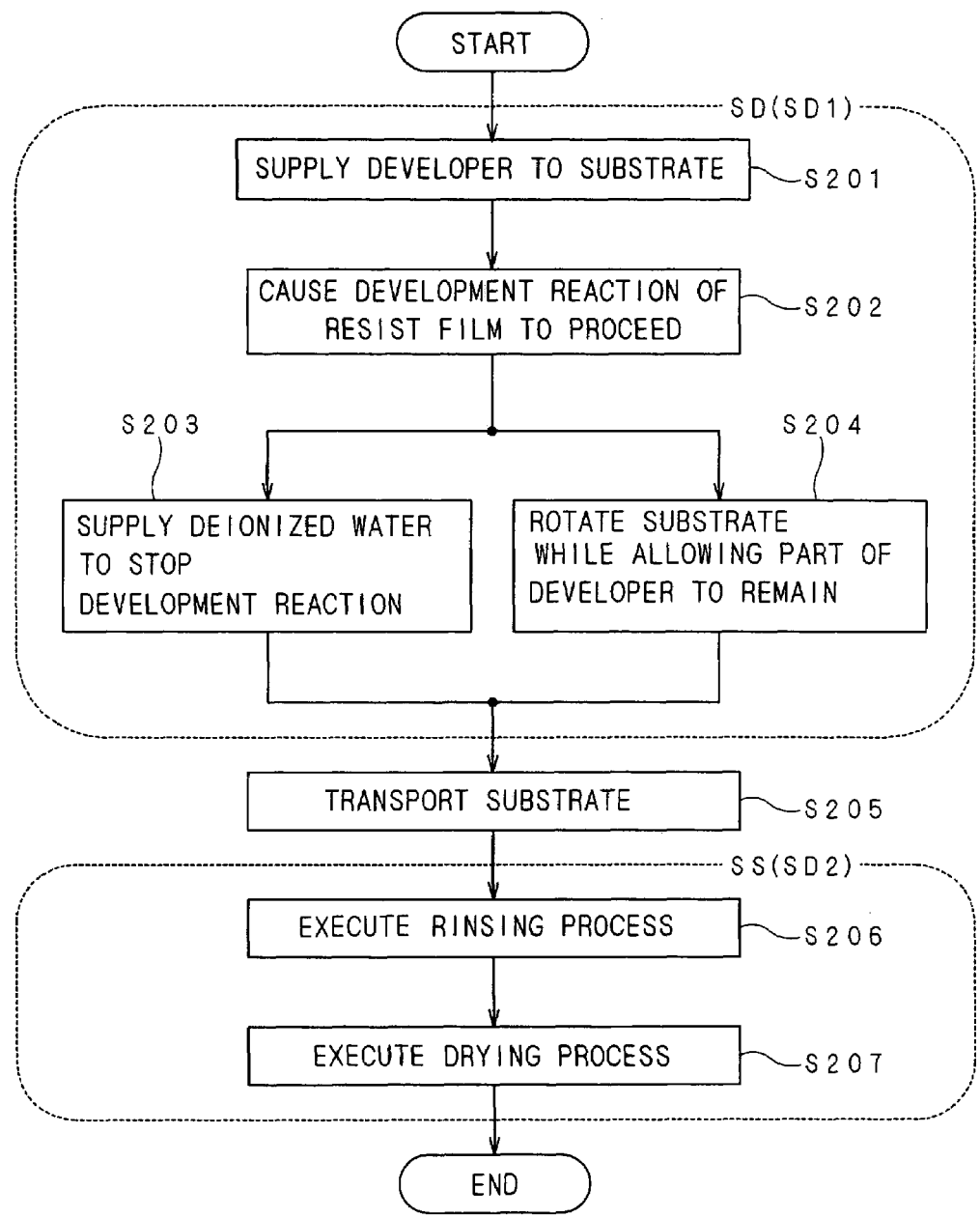
FIG. 12 is a flow chart showing a procedure of the development process according to the second and third preferred embodiments of the present invention.

FIG. 12 is a flow chart for illustrating the procedure of the development process according to the second preferred embodiment and a third preferred embodiment of the present invention. As shown in FIG. 12, the development process according to the second preferred embodiment includes a first process in which Steps S201 to S204 are executed in one of the development processing units SD1 and SD2, and a second process in which Steps S206 and S207 are executed in the rinsing processing unit SS. Because the development processing units SD1 and SD2 are substantially identical in hardware construction with each other, the procedure using only the development processing unit SD1 will be described below.

When a substrate W subjected to the exposure process and the heat treatment in the post-exposure bake unit PEB is transported into the development processing unit SD1 by the transport robot TR1, the developer is supplied to the transported substrate W in Step S201 in a manner similar to Step S101. The substrate W is held stationary for a predetermined length of time, with a puddle of developer allowed to remain on the substrate W. This causes the development reaction of the resist film to proceed (in Step S202).

Subsequently, the deionized water is supplied from the deionized water discharge nozzle 67 to the substrate W to stop the development reaction, and the substrate W is rotated to impart kinetic energy to the substrate W while part of the puddle of developer is allowed to remain on the surface of the substrate W, in Steps S203 and S204 in a manner similar to Steps S103 and S104. This makes the dissolution product 22 (See FIG. 9) easy to diffuse in the developer remaining on the surface of the substrate W to promote the dissolution of the resist.

Subsequently, the substrate W subjected to the first process in Steps S201 to S204 is transported by the transport robot TR1 out of the development processing unit SD1 into the rinsing processing unit SS, and is then held under suction by the substrate holder 85 (See FIG. 6) (in Step S205).

Subsequently, the substrate W transported into the rinsing processing unit SS is rotated by the substrate holder 85, and the deionized water is supplied to the vicinity of the center of the substrate W, whereby the rinsing process is executed (in Step S206). The supplied deionized water flows from the vicinity of the center of the substrate W toward a peripheral portion thereof due to centrifugal force to easily remove the dissolution product 22 of the resist film. Therefore, no dissolution products remain between the traces 23 of the pattern and on the anti-reflection film 25, and the satisfactory development process is accomplished in a manner similar to the first preferred embodiment.

Subsequently, after the completion of the rinsing process, further increasing the speed of rotation of the substrate W spins off the deionized water adhering to the surface of the substrate W, whereby a spin-drying process is performed (in Step S207). The development process is completed by the completion of the drying process of the substrate W.

2.2. Advantages of Substrate Processing Apparatus of Second Preferred Embodiment As described hereinabove, the substrate processing apparatus 1 according to the second preferred embodiment is capable of performing the first process of the development process by means of one of the development processing units SD1 and SD2 and performing the second process thereof by means of the rinsing processing unit SS. That is, the development process is not executed sequentially by means of one unit, but the first and second processes are executed in parallel by means of the two unit. This improves the throughput of the development process.

Additionally, the substrate processing apparatus 1 of the second preferred embodiment is capable of executing Steps S203 and S204 prior to the rinsing process in Step S206 in a manner similar to the first preferred embodiment. Therefore, the substrate processing apparatus 1 of the second preferred embodiment efficiently removes the dissolution products (resist residues) deposited on the substrate in the rinsing process in a manner similar to the first preferred embodiment.

3. Third Preferred Embodiment

Next, a third preferred embodiment according to the present invention will be described. The substrate processing apparatus of the third preferred embodiment is similar to that of the second preferred embodiment except that there is a difference between a developer supplyable to the substrate W in the development processing unit SD1 and a developer supplyable in the development processing unit SD2.

Specifically, a comparison between the procedures of the development processes according to the second and third preferred embodiments shows:

(1) a similarity in that the first process of the development process is executed in one of the development processing units SD1 and SD2, and (2) a difference in that the second process of the development process is executed in the rinsing processing unit SS according to the second preferred embodiment, but is executed in the development processing unit other than the one of the development processing units SD1 and SD2 in which the first process is executed according to the third preferred embodiment.

The difference will be mainly described below with reference to FIG. 12. Although the first and second processes of the development process are illustrated below as executed by the development processing units SD1 and SD2 respectively, the first process may be executed by the development processing unit SD2 and the second process be executed by the development processing unit SD1.

3.1. Procedure of Development Process

When a substrate W subjected to the exposure process and the post-exposure bake process is transported into the development processing unit SD1 by the transport robot TR1, the developer is supplied to the transported substrate W (in Step S201). The substrate W is held stationary, with a puddle of developer allowed to remain on the substrate W. This causes the development reaction of the resist film to proceed (in Step S202). That is, the puddle of developer supplyable from the developer discharge nozzle 61 of the development processing unit SD1 is placed on the substrate W to perform the development reaction.

Subsequently, the development reaction of the resist film is stopped, and the rotational motion of the substrate holder 51 imparts kinetic energy created by the centrifugal force to the substrate W, in Steps S203 and S204.

Subsequently, the substrate W subjected to the first process (in Steps S201 to S204) is transported by the transport robot TR1 out of the development processing unit SD1 into the development processing unit SD2 (in Step S205).

Subsequently, the substrate W transported into the development processing unit SD2 is rotated by the substrate holder 51 of the development processing unit SD2, and the deionized water is supplied from the deionized water discharge nozzle 62 to the vicinity of the center of the substrate W, whereby the rinsing process is executed (in Step S206). The spin-drying process is performed on the substrate W subjected to the rinsing process (in Step S207). The development process is completed by the completion of the drying process of the substrate W.

In general, it is necessary to select the developer depending on the type of the resist film formed on the surface of the substrate W to execute the development process. The development processing units SD1 and SD2 according to the third preferred embodiment can supply different types of developers, respectively. This enables the development process of the third preferred embodiment to select the development processing unit depending on the type of the resist film to execute the first process.

Thus, the third preferred embodiment achieves the increase in the number of types of developers supplyable in the entire substrate processing apparatus 1 without the increase in the number of developer discharge nozzles in the development processing units SD1 and SD2. Consequently, the third preferred embodiment is capable of executing the development process adaptable to a plurality of types of resists without the increase in size of the substrate processing apparatus 1 and without the complicated hardware construction of a developer supply system.

3.2. Advantages of Substrate Processing Apparatus of Third Preferred Embodiment As described hereinabove, the substrate processing apparatus 1 according to the third preferred embodiment is capable of performing the first and second processes of the development process by means of different development processing units. This allows the selection of a development processing unit in which the development reaction is to be performed, depending on the type of the resist film. Therefore, the third preferred embodiment achieves the development process using a plurality of types of developers with a simple construction without the complicated hardware construction of the developer supply system and without the increase in size of the substrate processing apparatus 1.

Additionally, the substrate processing apparatus 1 according to the third preferred embodiment is capable of performing the first and second processes of the development process by means of different units (the development processing units SD1 and SD2). Thus, the first and second processes may be performed in parallel in a manner similar to the second preferred embodiment, whereby the throughput of the development process is improved. Furthermore, the third preferred embodiment efficiently removes the dissolution products deposited on the substrate in the rinsing process in a manner similar to the first and second preferred embodiments.

4. Modifications

Although the first to third preferred embodiments according to the present invention have been described hereinabove, the present invention is not limited to the above-mentioned instances.

The development process is described assuming that the circular substrate is processed in the first to third preferred embodiments. The substrate to be processed is not limited to the circular substrate, but may be a rectangular substrate such as a substrate for a liquid crystal display. In this case, the width of a stream of developer discharged from the discharge slit 65 is required to be equal to or greater than the width of the rectangular substrate.

The substrate processing apparatus 1 is illustrated as including two development processing units in the first to third preferred embodiments. The number of development processing units according to the present invention is not limited to two, but three or more development processing units may be employed. Further, the number of development processing units may be one in the first and second preferred embodiments.

While the invention has been described in detail, the foregoing description is in all aspects illustrative and not restrictive. It is understood that numerous other modifications and variations can be devised without departing from the scope of the invention.

What is claimed is:

1. A substrate processing apparatus for performing a development process on a resist film formed on a surface of a substrate, comprising:
   a rotary holder for rotating said substrate while holding said substrate;
   a developer supply part for supplying a developer to the surface of said substrate held by said rotary holder;
   a controller configured to:
   stop said development reaction of said resist film, and
   impart kinetic energy created by centrifugal force of substrate rotation to a dissolution product solubilized by said developer of said resist film, by supplying said deionized water to said resist film from said deionized water supply part, and rotating said substrate by said rotary holder while allowing part of said developer supplied to the surface of said substrate to remain thereon; and then performing a rinsing process on said substrate by said rotary by supplying said deionized water from said deionized water supply part.

2. The substrate processing apparatus according to claim 1, wherein:
said deionized water supply part includes
a first deionized water nozzle for discharging a stream of deionized water whose width is not less than the diameter or width of said substrate, said first deionized water nozzle being capable of substantially translating over said substrate, and
a second deionized water nozzle capable of supplying said deionized water to the vicinity of the center of said substrate;
said first deionized water nozzle supplies said deionized water while moving substantially in parallel with the surface of said substrate when stopping said development reaction; and
said second deionized water nozzle supplies said deionized water when performing said rinsing process.

3. A substrate processing apparatus for performing a development process on a resist film formed on a surface of a substrate, comprising:
a first unit for performing a first process included in said development process;
a second unit for performing a second process included in said development process, said second process being performed subsequently to said first process; and
a transport unit for transferring a substrate between said first and second units, wherein:
said first unit includes
a first rotary holder for rotating said substrate while holding said substrate,
a developer supply part for supplying a developer to the surface of said substrate held by said first rotary holder,
a first deionized water supply part for supplying deionized water to the surface of said substrate held by said first rotary holder, and
a first controller for controlling operations of said first rotary holder and said first deionized water supply part, said controller causing said first deionized water supply part to supply said deionized water to the resist film in which a development reaction due to said developer supplied proceeds, thereby to stop said development reaction, and causing said first rotary holder to rotate said substrate while allowing part of said developer supplied to the surface of said substrate to remain thereon; and
said second unit includes
a second rotary holder for rotating said substrate while holding said substrate,
a second deionized water supply part for supplying deionized water to the surface of said substrate held by said second rotary holder, and
a second controller for causing said second deionized water supply part to supply said deionized water while causing said second rotary holder to rotate said substrate, whereby a rinsing process is performed on said substrate.

4. The substrate processing apparatus according to claim 3, wherein:
said first deionized water supply part includes
a first deionized water nozzle for discharging a stream of deionized water whose width is not less than the diameter or width of said substrate, said first deionized water nozzle being capable of substantially translating over said substrate held by said first rotary holder; and
said second deionized water supply part includes
a second deionized water nozzle capable of supplying said deionized water to the vicinity of the center of said substrate.

5. A substrate processing apparatus for performing a development process on a resist film formed on a surface of a substrate, comprising:
a first unit for performing a first process included in said development process:
a second unit for performing a second process included in said development process, said second process being performed subsequently to said first process; and
a transport unit for transferring a substrate between said first and second units, wherein
said first unit includes
a first rotary holder for rotating said substrate while holding said substrate,
a first developer supply part for supplying a first developer to the surface of said substrate held by said first rotary holder,
a first deionized water supply part for supplying deionized water to the surface of said substrate held by said first rotary holder, and
a first controller for controlling operations of said first rotary holder and said first deionized water supply part,
said first controller being capable of executing
the process of causing said first deionized water supply part to supply said deionized water to said resist film in which a development reaction due to said first developer supplied proceeds, thereby to stop said development reaction, and causing said first rotary holder to rotate said substrate while allowing part of said first developer supplied to the surface of said substrate to remain thereon, and
the process of causing said first deionized water supply part to supply said deionized water while causing said first rotary holder to rotate said substrate, thereby rinsing said substrate; and
said second unit includes
a second rotary holder for rotating said substrate while holding said substrate,
a second developer supply part for supplying a second developer to the surface of said substrate held by said second rotary holder,
a second deionized water supply part for supplying deionized water to the surface of said substrate held by said second rotary holder, and
a second controller for controlling operations of said second rotary holder and said second deionized water supply part,
said second controller being capable of executing
the process of causing said second deionized water supply part to supply said deionized water to said resist film in which a development reaction due to said second developer supplied proceeds, thereby to stop said development reaction, and causing said second rotary holder to rotate said substrate while allowing part of said second developer supplied to the surface of said substrate to remain thereon, and
the process of causing said second deionized water supply part to supply said deionized water while causing said second rotary holder to rotate said substrate, thereby rinsing said substrate.

6. The substrate processing apparatus according to claim 5, wherein:
each of said first and second deionized water supply parts includes a first deionized water nozzle for discharging a stream of deionized water whose width is not less than the diameter or width of said substrate, said first deionized water nozzle being capable of substantially translating over said substrate, and a second deionized water nozzle capable of supplying said deionized water to the vicinity of the center of said substrate;

said first deionized water nozzle supplies said deionized water while moving substantially in parallel with the surface of said substrate when stopping said development reaction; and said second deionized water nozzle supplies said deionized water when performing said rinsing process.

* * * * *

UNITED STATES PATENT AND TRADEMARK OFFICE
CERTIFICATE OF CORRECTION

PATENT NO. : 7,597,491 B2  Page 1 of 1
APPLICATION NO. : 11/245347
DATED : October 6, 2009
INVENTOR(S) : Harumoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 995 days.

Signed and Sealed this

Fourteenth Day of December, 2010

David J. Kappos
*Director of the United States Patent and Trademark Office*